(12) United States Patent
Yang

(10) Patent No.: US 6,686,645 B1
(45) Date of Patent: Feb. 3, 2004

(54) FUSE AND FUSE WINDOW STRUCTURE

(75) Inventor: Wu-Der Yang, Taoyuan (TW)

(73) Assignee: Nanya Technology Corporation, Taoyuan (TW)

(*) Notice: Subject to any disclaimer, the term of this patent is extended or adjusted under 35 U.S.C. 154(b) by 0 days.

(21) Appl. No.: 10/283,392

(22) Filed: Oct. 29, 2002

(30) Foreign Application Priority Data

Jul. 26, 2002 (TW) ........................................ 91116802 A

(51) Int. Cl.[7] ........................ H01L 29/76; H01L 29/00; H01L 31/036; H01L 23/48
(52) U.S. Cl. ........................ 257/529; 257/381; 257/508; 257/510; 257/774; 257/637
(58) Field of Search ................. 257/381, 508, 257/529, 510, 637, 774

(56) References Cited

U.S. PATENT DOCUMENTS 6,472,253 B1 * 10/2002 Bothra ........................ 438/131

2003/0094670 A1 * 5/2003 Hung et al. .................. 257/529

* cited by examiner

Primary Examiner—George Eckert
Assistant Examiner—Joseph Nguyen
(74) Attorney, Agent, or Firm—Merchant & Gould, P.C.

(57) ABSTRACT

A fuse structure. A first dielectric layer is formed on a substrate, a first conductive layer is formed on part of the first dielectric layer, a second dielectric layer is formed on part of the first dielectric layer and part of the first conductive layer, and a second conductive layer is formed on part of the second dielectric layer. A third dielectric layer is formed on part of the second conductive layer and part of the second dielectric layer, with an opening to expose part of the second conductive layer, to be defined as the laser spot position. A third conductive layer is formed on the third dielectric layer, with at least one conductive plug penetrating the second dielectric layer, to electrically connect the first conductive layer and the second conductive layer, to function as a fuse. Thus, in the present invention, the fuse structure of the third conductive layer can avoid damage to the adjacent fuse structure from the laser blow process.

18 Claims, 4 Drawing Sheets

FUSE AND FUSE WINDOW STRUCTURE

BACKGROUND OF THE INVENTION

1. Field of the Invention

The present invention relates to a fuse structure, and in particular the fuse structure of a third conductive layer, that can avoid damage to the adjacent fuse structure from the laser blow process in the laser spot of the fuse structure.

2. Description of the Related Art

Fuses are routinely used in the design of monolithic integrated circuits (IC), and in particular in memory devices as elements for altering the configuration of the circuitry contained therein. As such, memories are commonly built with programmed capabilities wherein fuses are selectively "blown" by a laser beam.

It is well known that random access memories (RAM) are designed with redundancies which include spare columns, rows, or even fully functional arrays, wherein when any of these spare elements fails, the defective row, column and the like are replaced by a corresponding element. Disabling and enabling of spare elements is accomplished by fuses which are blown (i.e., melted away) when required, preferably, by a laser beam.

Additionally, the technique of laser fuse deleting (trimming) has been widely used both in the memory and logic IC fabrication industries, as an effective way to improve functional yields and to reduce development cycle time. Yet, fuse blow yield and fuse reliability have been problematic in most conventional fuse designs.

FIG. 1 is a sectional view of a traditional fuse structure, and FIG. 1 shows a cross section B–B' of FIG. 3. FIG. 2 is a sectional view of a traditional fuse structure, and FIG. 2 shows a cross section C–C' of FIG. 3. FIG. 3 is a top view of a traditional fuse structure.

Referring to FIG. 1, symbol 100 shows a substrate. A first dielectric layer 120 is formed on the substrate 100. A metal layer M0 is formed on part of the first dielectric layer 120. A second dielectric layer 150 is formed on part of the metal layer M0 and part of the first dielectric layer 120. A metal layer M1 is formed on part of the second dielectric layer 150. At least one conductive plug 130 is defined through the second dielectric layer 150, for electrically connecting the M0 layer and the M1 layer.

Referring to FIG. 2, is a sectional view of a traditional fuse structure, and FIG. 2 shows the cross section C–C' of FIG. 3.

FIG. 3 is a top view of FIG. 1 and FIG. 2. There are plural fuse structures 210, 220, 230, 240, 250, 260 in fuse window 140. Each fuse structure comprises the M0 layer, the conductive plug 130 and the M1 layer. The solid line area shows the M1 layer, the dash line area shows the M0 layer, and each structure comprises its own optimal of a laser spot 110. To give an example, a laser beam 296 blows the position 110 of the fuse structure 240. Because of misalignment of the laser beam 290 or thermal scattering of the laser beam 290, thermal shock from the laser blow process can damage the M0 layer. This can cause the fuse structures to crack, seriously affecting device reliability and yield.

SUMMARY OF THE INVENTION

Accordingly, an object of the invention is to provide a fuse structure, and in particular a fuse structure of the third conductive layer that can avoid damage to the adjacent fuse structure from the laser blow process in the laser spot thereof.

The present invention provides a fuse structure. An optimal position of laser spot is defined above a substrate. A first dielectric layer is formed on the substrate. A first conductive layer is formed on part of the first dielectric layer. A second dielectric layer is formed on part of the first dielectric layer and part of the first conductive layer. A second conductive layer is formed on part of the second dielectric layer. A third dielectric layer is formed on part of the second conductive layer and part of the second dielectric layer. A third conductive layer is formed on the third dielectric layer and does not electrically connect the first conductive layer and second conductive layer, wherein the third conductive layer and third dielectric layer have an opening to reveal part of the second conductive layer, and define a laser spot of the fuse structure.

At least one conductive plug penetrates the second dielectric layer, to electrically connect the first conductive layer and the second conductive layer, to function as a fuse.

The advantage of the present invention is a third conductive layer placed on top of the second conductive layer. The third conductive layer has an opening to reveal part of the second conductive layer and define a laser spot of the fuse structure.

When a laser beam blows the fuse structure of a laser spot in the second conductive layer, the third conductive layer can obstruct or absorb superfluous laser energy, to prevent damage to the adjacent first conductive layer. The fuse structure of the prior art has no conductive layer or dielectric layer on the top of fuse structure.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

Figure 1:
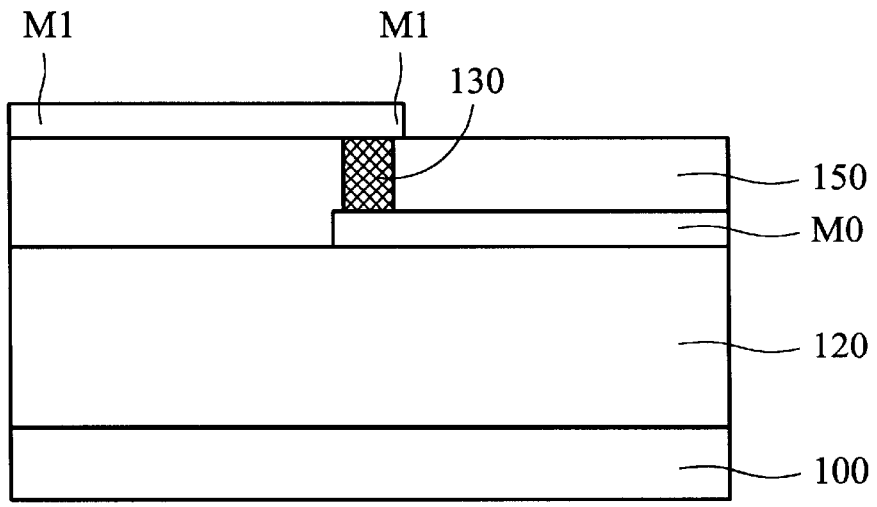
FIG. 1 is a sectional view of a traditional fuse structure, and shows cross section B–B' of FIG. 3.
Figure 2:
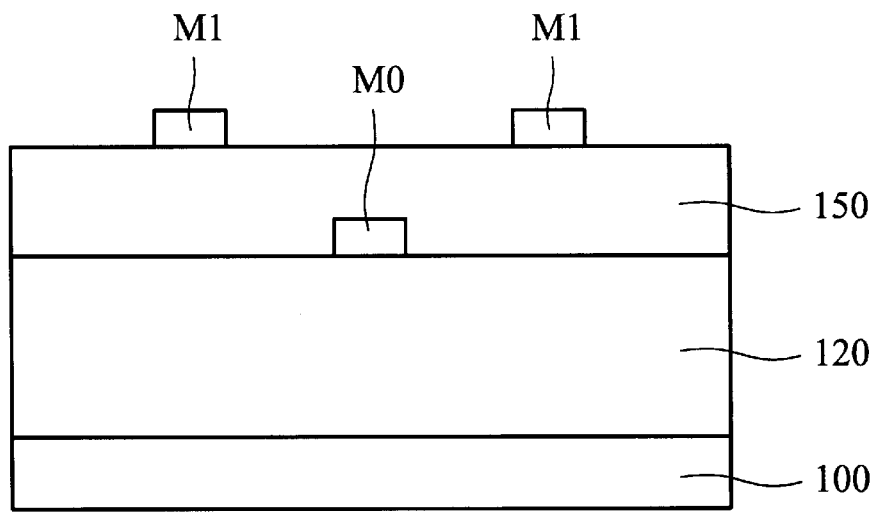
FIG. 2 is a sectional view of a traditional fuse structure, and shows cross section C–C' of FIG. 3.
Figure 3:
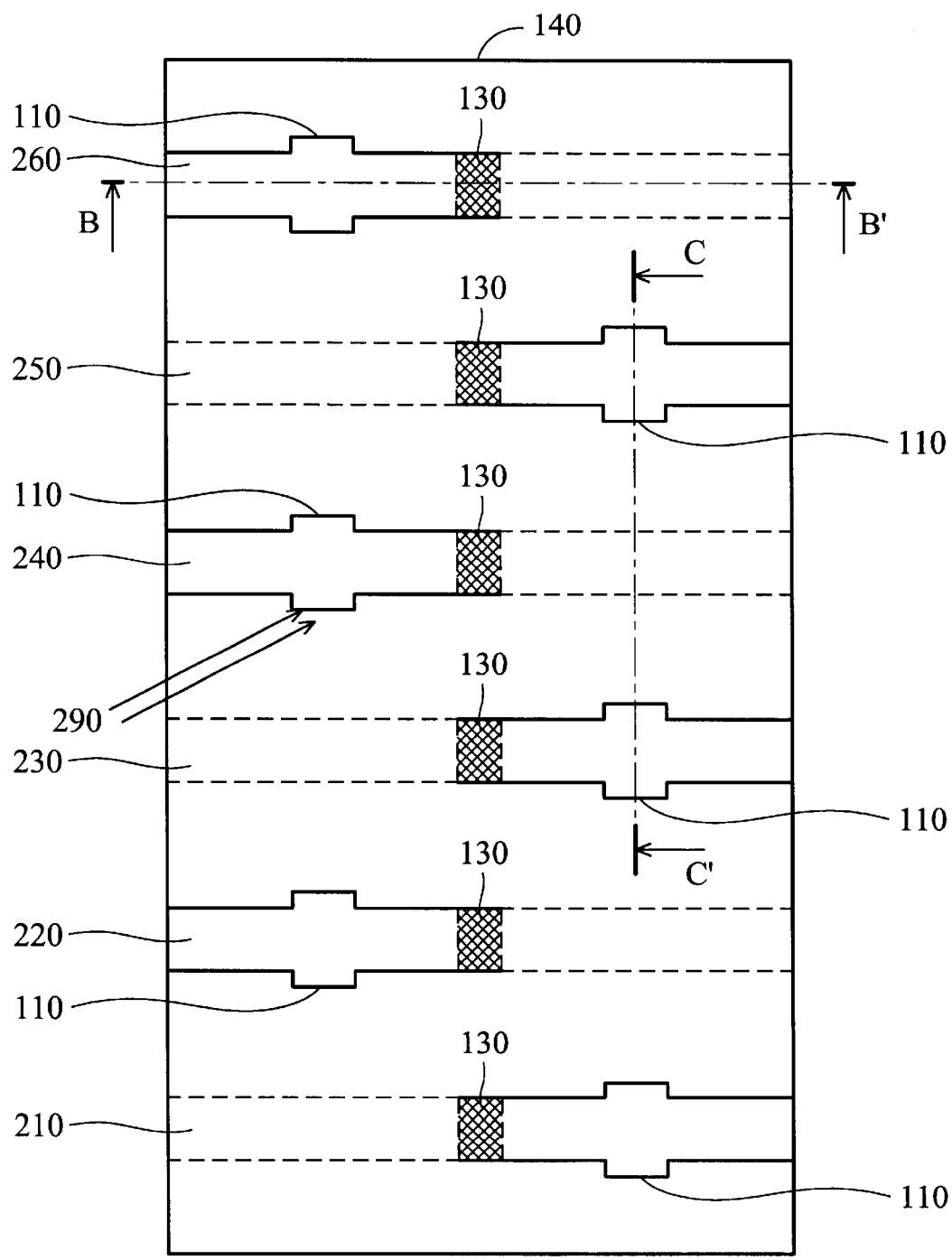
FIG. 3 is a top view of FIG. 1 and FIG. 2.
Figure 4:
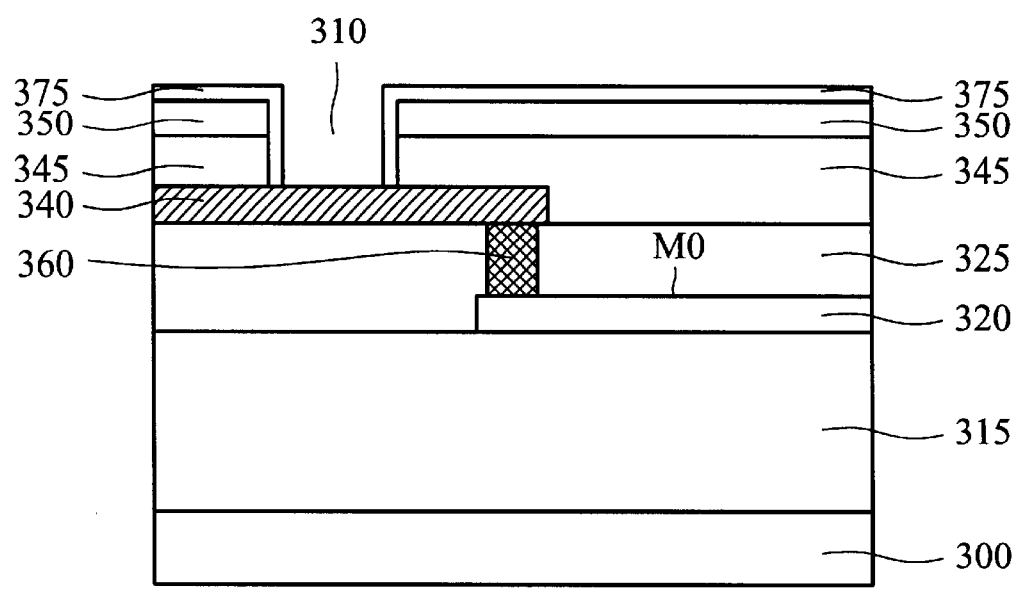
FIG. 4 is a sectional view of a fuse structure in the embodiment of the present invention, and shows cross section D–D' of FIG. 6.
Figure 5:
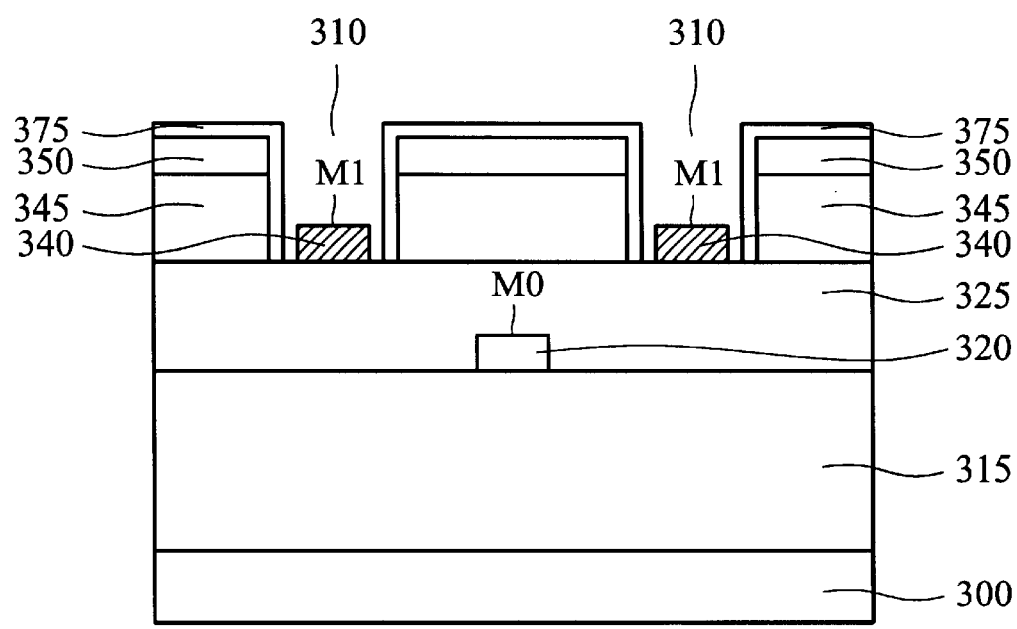
FIG. 5 is a sectional view of a fuse structure in the embodiment of the present invention, and shows cross section E–E' of FIG. 6.
Figure 6:
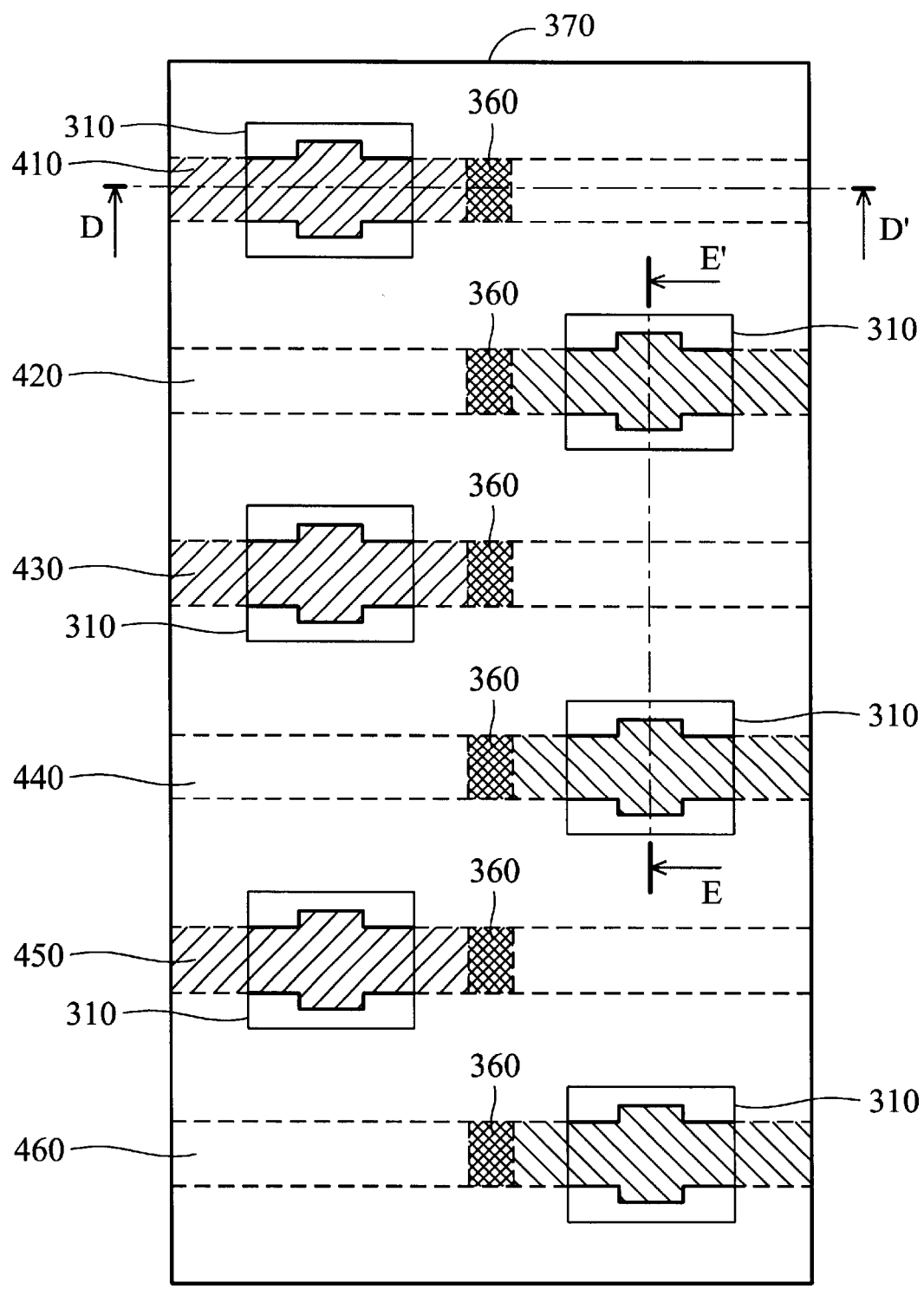
FIG. 6 is a top view of FIG. 4 and FIG. 5.

A fuse structure of the embodiment is shown with reference to FIG. 4, FIG. 5 and FIG. 6. FIG. 4 is a sectional view of a traditional fuse structure, and shows cross section D–D' of FIG. 6 of the present invention. FIG. 5 is a sectional view of a traditional fuse structure, and shows cross section E–E' of FIG. 6 of the present invention. FIG. 6 is a top view of FIG. 4 and FIG. 5. In FIG. 4 and FIG. 5, the first conductive layer 320 is M0, the second conductive layer 340 is M1, the third conductive 350 is M3.

FIG. 4 shows a substrate 300. A first dielectric layer 315 is formed on the substrate 300. A first conductive layer 320 is formed on part of the first dielectric layer 315. The substrate 300 may be Si. The first dielectric layer 315 may be $SiO_2$.

In FIG. 4, a second dielectric layer 325 is formed on part of the first dielectric layer 315 and part of the first conductive 320. The second dielectric layer 325 may be $SiO_2$.

In FIG. 4, a second conductive later 340 is formed on part of the second dielectric layer 325. A third dielectric layer 345 is formed on part of the second conductive layer 340 and part of the second dielectric layer 325. A third conductive layer 350 is formed on the third dielectric layer 345, with an opening to reveal part of the second conductive layer 340, and define a laser spot 310 of the fuse structure. An insulation layer 375 is formed on the third conductive layer 350 and on the sides of the wall with an opening.

In FIG. 4, a conductive plug 360 penetrates the second dielectric layer 325, to electrically connect the first conductive layer 320 and the second conductive layer 340, to function as a fuse. The conductive plug is tungsten.

FIG. 5 is a sectional view of a traditional fuse structure, and shows cross section E–E' of FIG. 6 of the present invention.

FIG. 6 is a top view of FIG. 4 and FIG. 5. Generally, plural fuse structures 410, 420, 430, 440, 450, 460 are formed in the fuse window 370, and each fuse structure has its own laser spot 310 not electrically connected with others.

Referring to FIG. 4, superfluous laser energy is obstructed or absorbed by the third conductive layer 350 to prevent damage to the adjacent first conductive layer 320 under the second conductive layer 340. This prevents the fuse structure from failing when the first conductive layer 320 is broken, and enhances device reliability and yield.

Finally, while the invention has been described by way of example and in terms of the above preferred embodiments, it is to be understood that the invention is not limited to the disclosed embodiments. On the contrary, it is intended to cover various modifications and similar arrangements as would be apparent to those skilled in the art. Therefore, the scope of the appended claims should be accorded the broadest interpretation so as to encompass all such modifications and similar arrangements.

What is claimed is:

1. A fuse structure, comprising:

a substrate;

a first dielectric layer formed on the substrate;

a first conductive layer formed on part of the first dielectric layer;

a second dielectric layer formed on part of the first dielectric layer and part of the first conductive layer;

a second conductive layer formed on part of the second dielectric layer;

a third dielectric layer formed on part of the second conductive layer and part of the second dielectric layer;

a third conductive layer formed on the third dielectric layer, wherein the third conductive layer and third dielectric layer have an opening to reveal part of the second conductive layer and define a laser spot of the fuse structure; and at least one conductive plug penetrating the second dielectric layer, to electrically connect the first conductive layer and the second conductive layer.

2. The fuse structure according to claim 1, wherein the first conductive layer is tungsten.

3. The fuse structure according to claim 1, wherein the second conductive layer is aluminum, copper-aluminum alloy or polysilicon.

4. The fuse structure according to claim 1, wherein the third conductive layer is aluminum, copper-aluminum alloy or polysilicon.

5. The fuse structure according to claim 1, wherein the first dielectric layer is $SiO_2$.

6. The fuse structure according to claim 1, wherein the second dielectric layer is $SiO_2$.

7. The fuse structure according to claim 1, wherein the third dielectric layer is $SiO_2$.

8. The fuse structure according to claim 1, wherein the conductive plug is tungsten.

9. The fuse structure according to claim 1, further comprising an insulation layer with an opening formed on the third conductive layer.

10. The fuse structure according to claim 9, wherein the insulation layer is formed on the walls of the opening.

11. A fuse window having a plurality of fuse structures, each of the fuse structures comprising:

a substrate;

a first dielectric layer formed on the substrate;

a first conductive layer formed on part of the first dielectric layer;

a second dielectric layer formed on part of the first dielectric layer and part of the first conductive layer;

a second conductive layer formed on part of the second dielectric layer;

a third dielectric layer formed on part of the second conductive layer and part of the second dielectric layer;

a third conductive layer formed on the third dielectric layer, wherein the third conductive layer and third dielectric layer have an opening to reveal part of the second conductive layer and define a laser spot of the fuse structure; and at least one conductive plug penetrating the second dielectric layer, to electrically connect the first conductive layer and the second conductive layer.

12. The fuse structure according to claim 11, wherein the first conductive layer is tungsten.

13. The fuse structure according to claim 11, wherein the second conductive layer is aluminum, copper-aluminum alloy or polysilicon.

14. The fuse structure according to claim 11, wherein the third conductive layer is aluminum, copper-aluminum alloy or polysilicon.

15. The fuse structure according to claim 11, wherein the first dielectric layer is $SiO_2$.

16. The fuse structure according to claim 11, wherein the second dielectric layer is $SiO_2$.

17. The fuse structure according to claim 11, wherein the third dielectric layer is $SiO_2$.

18. The fuse structure according to claim 11, wherein the conductive plug is tungsten.

* * * * *